United States Patent
Suchindran et al.

(10) Patent No.: US 12,359,981 B2
(45) Date of Patent: Jul. 15, 2025

(54) SYSTEMS AND METHODS FOR EFFECTIVE READING OF MULTIPLE TEMPERATURE SENSORS ON MEMORY MODULES

(71) Applicant: Dell Products, L.P., Round Rock, TX (US)

(72) Inventors: Vaishnavi Suchindran, Bangalore (IN); Ravi Shekhar Singh, Bangalore (IN); Balamurugan Gnanasambandam, Bengaluru (IN)

(73) Assignee: Dell Product, L.P., Round Rock, TX (US)

( * ) Notice: Subject to any disclaimer, the term of this patent is extended or adjusted under 35 U.S.C. 154(b) by 538 days.

(21) Appl. No.: 17/814,262

(22) Filed: Jul. 22, 2022

(65) Prior Publication Data

US 2024/0027277 A1    Jan. 25, 2024

(51) Int. Cl.
| | |
|---|---|
| *G01K 1/02* | (2021.01) |
| *G06F 1/20* | (2006.01) |
| *G06F 11/30* | (2006.01) |
| *G01D 3/00* | (2006.01) |
| *G01D 3/028* | (2006.01) |
| *H01L 23/34* | (2006.01) |

(52) U.S. Cl.
CPC ............ *G01K 1/026* (2013.01); *G06F 1/206* (2013.01); *G06F 11/3037* (2013.01); *G06F 11/3058* (2013.01); *G01D 3/00* (2013.01); *G01D 3/028* (2013.01); *H01L 23/34* (2013.01)

(58) Field of Classification Search
CPC ...... G01K 1/026; G06F 1/206; G06F 11/3037; G06F 11/3058; G01D 3/00; G01D 3/028; H01L 23/34
See application file for complete search history.

(56) References Cited

U.S. PATENT DOCUMENTS

| | | | |
|---|---|---|---|
| 6,269,412 B1 * | 7/2001 | Liu | G06F 11/0787 |
| | | | 714/39 |
| 6,531,911 B1 * | 3/2003 | Hsu | G05F 3/30 |
| | | | 327/512 |
| 7,428,644 B2 * | 9/2008 | Jeddeloh | G06F 1/3275 |
| | | | 713/340 |

(Continued)

*Primary Examiner* — Laura Martin
*Assistant Examiner* — Philip L Cotey
(74) *Attorney, Agent, or Firm* — Fogarty LLP

(57) ABSTRACT

Effectively reading multiple temperature sensors on memory modules may include reading a first of a plurality of temperature sensors on each memory module of a plurality of memory modules, reading a second of the plurality of temperature sensors on each memory module, after reading the first sensors on each memory module, and, if present, reading a third of the plurality of temperature sensors on each memory module of the plurality of memory modules, after reading the second of the sensors on each memory module. The first temperature sensors may be reread prior to reading the third temperature sensors, particularly where the first temperature sensors are middle temperature sensors on each memory module. Upon failing to read a particular temperature sensor, neighboring temperature sensors of the particular temperature sensor may be polled, such as (an) other temperature sensor(s) on the same memory module and/or (a) temperature sensor(s) on adjacent memory module(s).

20 Claims, 5 Drawing Sheets

500

505
FAILURE TO READ A PARTICULAR TEMPERATURE SENSOR OF A PLURALITY OF TEMPERATURE SENSORS ON A PLURALITY OF INFORMATION HANDLING SYSTEM MEMORY MODULES

510
POLL A PLURALITY OF NEIGHBORING MEMORY MODULE TEMPERATURE SENSORS TO THE PARTICULAR (FAILED) TEMPERATURE SENSOR

(56) References Cited

U.S. PATENT DOCUMENTS

| | | | |
|---|---|---|---|
| 7,450,456 B2* | 11/2008 | Jain | G11C 7/1063 |
| | | | 365/228 |
| 7,953,573 B2* | 5/2011 | Walker | G01R 31/2874 |
| | | | 374/176 |
| 9,081,501 B2* | 7/2015 | Asaad | G06F 15/76 |
| 9,678,490 B2* | 6/2017 | Berke | G06F 1/206 |
| 11,042,208 B2* | 6/2021 | Basu | G06F 9/5094 |
| 2002/0066001 A1* | 5/2002 | Olarig | G06F 13/1694 |
| | | | 711/170 |
| 2004/0260957 A1* | 12/2004 | Jeddeloh | G06F 1/3225 |
| | | | 713/300 |
| 2006/0049512 A1* | 3/2006 | Goodwin | H01L 23/36 |
| | | | 257/E23.101 |
| 2007/0140030 A1* | 6/2007 | Wyatt | G11C 5/00 |
| | | | 365/212 |
| 2007/0211548 A1* | 9/2007 | Jain | G06F 11/3058 |
| | | | 365/211 |
| 2008/0043556 A1* | 2/2008 | Nale | G06F 1/206 |
| | | | 374/E7.043 |
| 2008/0052483 A1* | 2/2008 | Rangarajan | G06F 12/0646 |
| | | | 711/170 |
| 2008/0086282 A1* | 4/2008 | Artman | H01L 23/34 |
| | | | 374/E7.043 |
| 2008/0103634 A1* | 5/2008 | Santos | G05D 23/19 |
| | | | 700/299 |
| 2010/0005366 A1* | 1/2010 | Dell | G11C 29/70 |
| | | | 714/764 |
| 2013/0047142 A1* | 2/2013 | Bates | G06F 9/5016 |
| | | | 718/100 |
| 2015/0134954 A1* | 5/2015 | Walley | H04L 63/0823 |
| | | | 713/168 |
| 2015/0373876 A1* | 12/2015 | Berke | G05D 23/1919 |
| | | | 700/282 |
| 2019/0340142 A1* | 11/2019 | Patel | G06F 13/24 |
| 2019/0348108 A1* | 11/2019 | Chang | G11C 5/04 |
| 2020/0258591 A1* | 8/2020 | Chaiken | G11C 7/04 |
| 2021/0240617 A1* | 8/2021 | Rao | G06F 12/08 |
| 2022/0066899 A1* | 3/2022 | Sloat | G06F 12/0868 |
| 2022/0205846 A1* | 6/2022 | Chen | H01L 21/67248 |
| 2023/0105565 A1* | 4/2023 | Risbud | G06F 11/073 |
| | | | 714/704 |
| 2023/0176634 A1* | 6/2023 | Winkler | G06F 1/3296 |
| | | | 700/300 |
| 2023/0197168 A1* | 6/2023 | Song | G11C 11/5628 |
| | | | 365/185.21 |

* cited by examiner

SYSTEMS AND METHODS FOR EFFECTIVE READING OF MULTIPLE TEMPERATURE SENSORS ON MEMORY MODULES

FIELD

This disclosure relates generally to Information Handling Systems (IHSs), and, more specifically, to systems and methods for effectively reading multiple temperature sensors on memory modules.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Real time analytics, gaming, telemetry, in-memory computation and other applications drive an ever-increasing demand for higher memory bandwidth that data centers must meet without affecting the data center's power profile. This has led to fifth generation Double Data Rate (DDR) (DDR5) Dynamic Random Access Memory (DRAM) based memory subsystems for servers, and the like. DDR5 imposes greater demands for system power delivery, thermal performance, etc. DDR5 memory modules have their own power management and additional temperature sensors, compared with DDR4 and earlier DRAM.

SUMMARY

Embodiments for effective reading of multiple temperature sensors on memory modules are described. In an illustrative, non-limiting example an Information Handling System (IHS) may have a plurality of memory modules, wherein each memory module has a plurality of temperature sensors, such as fifth generation Double Data Rate (DDR) (DDR5) Dynamic Random Access Memory (DRAM). The IHS may also have a fan controller, or the like. This fan controller, or the like, may be configured to read a first of the plurality of temperature sensors on each memory module of the plurality of memory modules, read a second of the plurality of temperature sensors on each memory module of the plurality of memory modules, after reading the first of the plurality of temperature sensors on each memory module of the plurality of memory modules, and, if present, read a third of the plurality of temperature sensors on each memory module of the plurality of memory modules, after reading the second of the plurality of temperature sensors on each memory module of the plurality of memory modules. The first of the temperature sensors on each memory module may be reread, after reading the second, before reading the third temperature sensors on each memory module, such as, for example, where the first of the plurality of temperature sensors on each memory module is a middle temperature sensor on each memory module.

The fan controller, or the like, may be further configured to, upon failing to read a particular temperature sensor, poll neighboring temperature sensors of the plurality of temperature sensors on the plurality of memory modules of the particular (failed) temperature sensor. In some cases, the neighboring temperature sensors of the particular temperature sensor may be (an) other temperature sensor(s) on the same memory module as the particular temperature sensor (that failed), and/or the neighboring temperature sensors may be (a) temperature sensor(s) on a memory module adjacent to the memory module of the particular (failed) temperature sensor. For example, where the particular (failed) temperature sensor is a middle temperature sensor on a memory module, the fan controller, or the like, may be further configured to poll temperature sensors on each side of the particular temperature sensor on the same memory module and poll temperature sensors on each adjacent memory module. In another example, where the (failed) particular temperature sensor is an end (corner) temperature sensor on a memory module, the fan controller, or the like, may be further configured to poll a middle temperature sensor on that same memory module and poll each adjacent end (corner) temperature sensor and each middle temperature sensor on (each) adjacent memory module(s).

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, touchscreen and/or a video display. The IHS may also include one or more buses operable to transmit communications between the various hardware components. A more detailed example of an IHS is described with respect to FIG. 1

Figure 1:
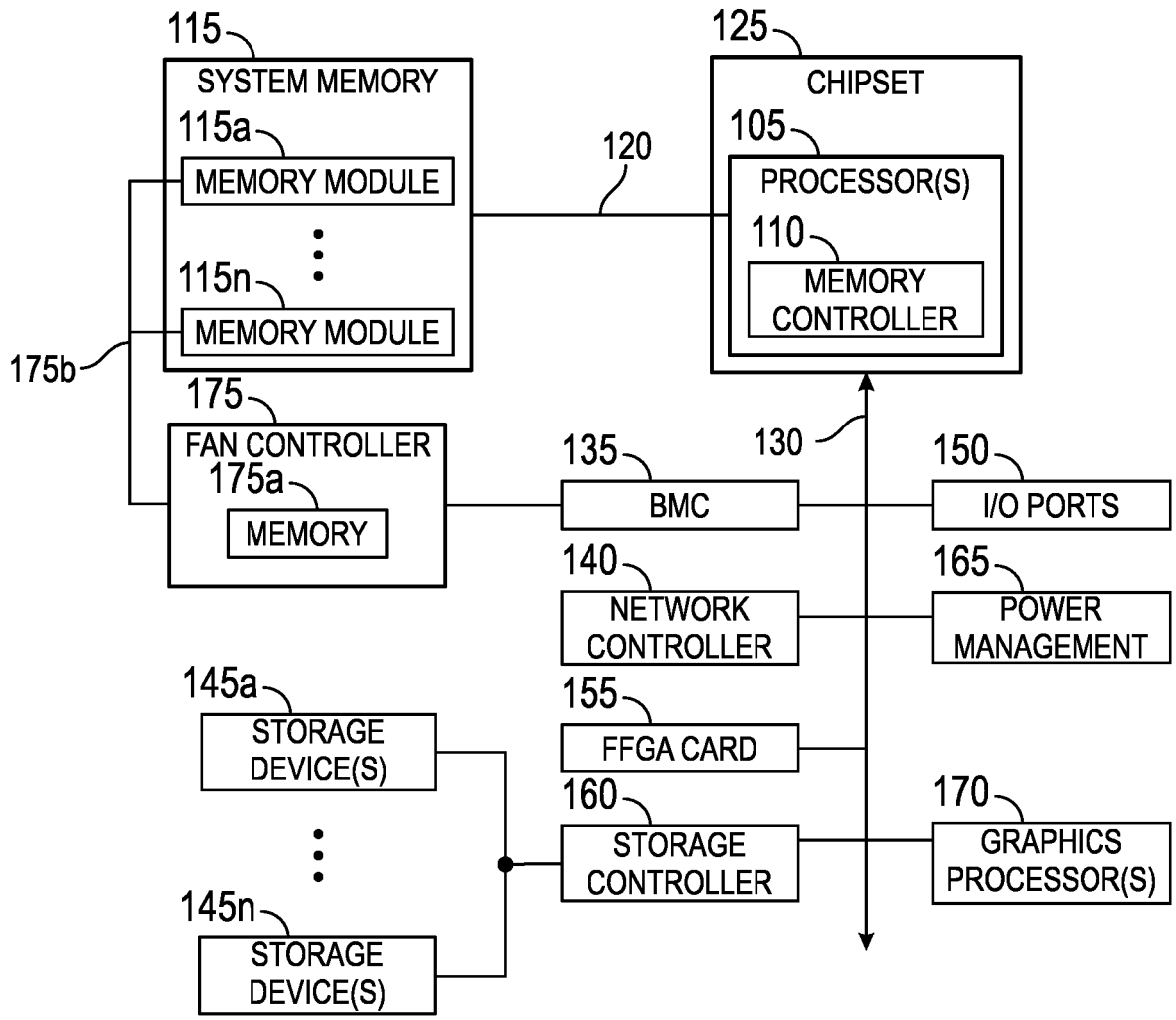
FIG. 1 is a block diagram illustrating components of an example of an Information Handling System (IHS), according to some embodiments.

FIG. 1 is a block diagram illustrating components of example IHS 100, according to some embodiments. IHS 100 may utilize one or more processors 105. In some embodiments, processors 105 may include a main processor and a co-processor, each of which may include a plurality of processing cores that, in certain scenarios, may each be used to run an instance of a server process. In certain embodiments, one or all of processor(s) 105 may be graphics processing units (GPUs) in scenarios where IHS 100 has been configured to support functions such as multimedia services and graphics applications.

As illustrated, processor(s) 105 includes an integrated memory controller 110 that may be implemented directly within the circuitry of the processor 105, or the memory controller 110 may be a separate integrated circuit that is located on the same die as the processor 105. The memory controller 110 may be configured to manage the transfer of data to and from the system memory 115 of the IHS via a high-speed memory interface 120. The system memory 115 is coupled to processor(s) 105 via a memory bus 120 that provides the processor(s) 105 with high-speed memory used in the execution of computer program instructions by the processor(s) 105. Accordingly, system memory 115 may include memory components, such as static RAM (SRAM), dynamic RAM (DRAM), NAND Flash memory, suitable for supporting high-speed memory operations by the processor(s) 105. In certain embodiments, system memory 115 may combine both persistent, non-volatile memory and volatile memory.

In certain embodiments, the system memory 115 may be comprised of multiple removable memory modules. The system memory 115 of the illustrated embodiment includes removable memory modules 115a-n. Each of the removable memory modules 115a-n may correspond to a printed circuit board memory socket that receives a removable memory module 115a-n, such as a Dual In-line Memory Module (DIMM), that can be coupled to the socket and then decoupled from the socket as needed, such as to upgrade memory capabilities or to replace faulty memory modules. The terms "DIMM," "memory module," and the like are used interchangeably herein, but may refer to any memory configuration. For example, other embodiments of IHS memory 115 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory, or soldered-in memory modules affixed to an IHS motherboard, etc. Embodiments of the present systems and methods are directed to effective reading multiple temperature sensors employed on memory modules, such as fifth generation Double Data Rate (DDR) (DDR5) DRAM.

IHS 100 may utilize chipset 125 that may be implemented by integrated circuits that are coupled to processor(s) 105. In this embodiment, processor(s) 105 is depicted as a component of chipset 125. In other embodiments, all of chipset 125, or portions of chipset 125 may be implemented directly within the integrated circuitry of processor(s) 105. The chipset may provide the processor(s) 105 with access to a variety of resources accessible via one or more buses 130. Various embodiments may utilize any number of buses to provide the illustrated pathways served by bus 130. In certain embodiments, bus 130 may include a PCIe switch fabric that is accessed via a PCIe root complex.

As illustrated, IHS 100 includes BMC 135 to provide capabilities for remote monitoring and management of various aspects of IHS 100. In support of these operations, BMC 135 may utilize both in-band, sideband and/or out of band communications with certain managed components of IHS 100, such as, for example, processor(s) 105, system memory 115, chipset 125, network controller 140, storage device(s) 145, etc. BMC 135 may be installed on the motherboard of IHS 100 or may be coupled to IHS 100 via an expansion slot provided by the motherboard. As a non-limiting example of a BMC, the integrated Dell Remote Access Controller (iDRAC) from Dell® is embedded within Dell PowerEdge™ servers and provides functionality that helps information technology (IT) administrators deploy, update, monitor, and maintain servers remotely. BMC 135 may include non-volatile memory having program instructions stored thereon that are usable by CPU(s) 105 to enable remote management of IHS 100. For example, BMC 135 may enable a user to discover, configure, and manage BMC 135, setup configuration options, resolve and administer hardware or software problems, etc. Additionally, or alternatively, BMC 135 may include one or more firmware volumes, each volume having one or more firmware files used by the BIOS' firmware interface to initialize and test components of IHS 100.

IHS 100 may also include the one or more I/O ports 150, such as USB ports, PCIe ports, TPM (Trusted Platform Module) connection ports, HDMI ports, audio ports, docking ports, network ports, Fibre Channel ports and other storage device ports. Such I/O ports 150 may be externally accessible or may be internal ports that are accessed by opening the enclosure of the IHS 100. Through couplings made to these I/O ports 150, users may couple the IHS 100 directly to other IHSs, storage resources, external networks and a vast variety of peripheral components.

As illustrated, IHS 100 may include one or more FPGA (Field-Programmable Gate Array) cards 155. Each of the FPGA card 155 supported by IHS 100 may include various processing and memory resources, in addition to an FPGA logic unit that may include circuits that can be reconfigured after deployment of IHS 100 through programming functions supported by the FPGA card 155. Through such reprogramming of such logic units, each individual FGPA card 155 may be optimized to perform specific processing tasks, such as specific signal processing, security, data mining, and artificial intelligence functions, and/or to support specific hardware coupled to IHS 100. In some embodiments, a single FPGA card 155 may include multiple FPGA logic units, each of which may be separately programmed to implement different computing operations, such as in computing different operations that are being offloaded from processor 105.

IHS 100 may include one or more storage controllers 160 that may be utilized to access storage devices 145*a-n* that are accessible via the chassis in which IHS 100 is installed. Storage controller 160 may provide support for RAID (Redundant Array of Independent Disks) configurations of logical and physical storage devices 145*a-n*. In some embodiments, storage controller 160 may be an HBA (Host Bus Adapter) that provides more limited capabilities in accessing physical storage devices 145*a-n*. In some embodiments, storage devices 145*a-n* may be replaceable, hot-swappable storage devices that are installed within bays provided by the chassis in which IHS 100 is installed. In embodiments where storage devices 145*a-n* are hot-swappable devices that are received by bays of chassis, the storage devices 145*a-n* may be coupled to IHS 100 via couplings between the bays of the chassis and a midplane of IHS 100. In some embodiments, storage devices 145*a-n* may also be accessed by other IHSs that are also installed within the same chassis as IHS 100. Storage devices 145*a-n* may include SAS (Serial Attached SCSI) magnetic disk drives, SATA (Serial Advanced Technology Attachment) magnetic disk drives, solid-state drives (SSDs) and other types of storage devices in various combinations.

As noted, processor(s) 105 may also be coupled to a network controller 140 via bus 130, such as provided by a Network Interface Controller (NIC) that allows the IHS 100 to communicate via an external network, such as the Internet or a LAN. In some embodiments, network controller 140 may be a replaceable expansion card or adapter that is coupled to a motherboard connector of IHS 100. In some embodiments, network controller 140 may be an integrated component of IHS 100.

A variety of additional components may be coupled to processor(s) 105 via bus 130. For instance, processor(s) 105 may also be coupled to a power management unit 165 that may interface with a power supply of IHS 100. In certain embodiments, a graphics processor 170 may be comprised within one or more video or graphics cards, or an embedded controller, installed as components of the IHS 100.

In certain embodiments, IHS 100 may operate using a BIOS (Basic Input/Output System) that may be stored in a non-volatile memory accessible by the processor(s) 105. The BIOS may provide an abstraction layer by which the operating system of the IHS 100 interfaces with the hardware components of the IHS. Upon powering or restarting IHS 100, processor(s) 105 may utilize BIOS instructions to initialize and test hardware components coupled to the IHS, including both components permanently installed as components of the motherboard of IHS 100 and removable components installed within various expansion slots supported by the IHS 100. The BIOS instructions may also load an operating system for use by the IHS 100. In certain embodiments, IHS 100 may utilize Unified Extensible Firmware Interface (UEFI) in addition to or instead of a BIOS. In certain embodiments, the functions provided by a BIOS may be implemented, in full or in part, by the remote access controller 160. In some embodiments, BIOS may be configured to identify hardware components that are detected as being currently installed in IHS 100. In such instances, the BIOS may support queries that provide the described unique identifiers that have been associated with each of these detected hardware components by their respective manufacturers. In providing an abstraction layer by which hardware of IHS 100 is accessed by an operating system, BIOS may identify the I/O ports 150 that are recognized and available for use.

In some embodiments, IHS 100 may include a TPM (Trusted Platform Module) that may include various registers, such as platform configuration registers, and a secure storage, such as an NVRAM (Non-Volatile Random-Access Memory). The TPM may also include a cryptographic processor that supports various cryptographic capabilities. In IHS embodiments that include a TPM, a pre-boot process implemented by the TPM may utilize its cryptographic capabilities to calculate hash values that are based on software and/or firmware instructions utilized by certain core components of IHS, such as the BIOS and boot loader of IHS 100. These calculated hash values may then be compared against reference hash values that were previously stored in a secure non-volatile memory of the IHS, such as during factory provisioning of IHS 100. In this manner, a TPM may establish a root of trust that includes core components of IHS 100 that are validated as operating using instructions that originate from a trusted source.

With respect to embodiments of the present systems and methods, it should be noted that components of IHS 100 consume electrical power and can generate significant amounts of heat. Heat within IHS 100 may degrade the reliability and performance of various internal components of the IHS, possibly resulting in costly malfunctions and component failures. In order to ventilate heated air out of the IHS and away from internal components, an IHS may utilize one or more cooling fans. An IHS airflow cooling system may utilize an open-loop control or a closed-loop control system in order to determine fan speed settings for the one or more cooling fans that are available to the cooling system of the IHS. Closed-loop control systems typically utilize measured temperature information collected from temperature sensors located at various locations within the IHS, including, per embodiments of the present systems and methods on DIMMs. Based on the collected temperature information, a closed-loop control system may operate the cooling fan(s) in order generate sufficient airflow cooling to maintain the temperatures of internal components at or below desired target values. Closed-loop thermal control systems provide the ability to precisely control fan speeds based on observed conditions within the IHS. As such, closed-loop control systems may both reduce unnecessary operation of the cooling fan(s), while still ensuring component temperature levels remain at or below a desired target value.

In illustrated IHS 100, chipset 125 may provide a fan controller or access to separate fan controller 175, or the like, that may be used to operate an airflow cooling system that includes one or more cooling fans. More specifically, fan controller 175 may generate a target airflow within the internal compartments of the IHS 100 by operating and adjusting the speed of the cooling fan(s) that comprise the airflow cooling system. The fan controller may include internal fan controller memory 175*a* that may be used to store data relied upon by the fan controller. In certain embodiments, the fan controller memory may store tables of configuration settings and boundary conditions for the cooling fan(s) operated by the fan controller. In certain embodiments, the fan controller memory may be used to store one or more thermal control algorithms that may be used, in accordance with embodiments of the present systems and methods, to calculate airflow requirements. The fan controller may be configured to interoperate with one or more environmental sensors, such as in accordance with embodiments of the present systems and methods, a plurality of temperature sensors deployed on each memory module 115a-n, in order to monitor temperature conditions at one or more internal locations within the IHS 100, such as the temperature of each memory module 115a-n. Where the fan controller implements closed-loop thermal control, the fan controller may utilize temperature readings provided by the sensors in operating the cooling fan(s). The fan controller may communicate with the sensors directly, such as via an I2C or I3C bus interface 175b, which may be supported by IHS chipset 125. In other implementations, the fan controller may receive information from the sensors indirectly via software processes that monitor and collect the sensor information. In certain embodiments, the fan controller may be an embedded microcontroller on the motherboard of the IHS 100 or in chipset 125. In other embodiments, the fan controller 114 may be a stand-alone integrated circuit board, or the like, that is installed as a component of IHS 100. In certain embodiments, the fan controller 114 may be configured to interoperate with BMC 135 so as to enable remote administration, or the like, of the fan controller. In certain of such embodiments, various aspects of the operation of the cooling fan(s) by the fan controller may be implemented by BMC 135.

In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 105 as a systems-on-a-chip (SoC).

A person of ordinary skill in the art will appreciate that IHS 100 is merely illustrative and is not intended to limit the scope of the disclosure described herein. In particular, any computer system and/or device may include any combination of hardware or software capable of performing certain operations described herein. In addition, the operations performed by the illustrated components may, in some embodiments, be performed by fewer components or distributed across additional components. Similarly, in other embodiments, the operations of some of the illustrated components may not be performed and/or other additional operations may be available.

A person of ordinary skill will recognize that IHS 100 of FIG. 1, which is generally depicted as a server IHS, is only one example of a system in which the certain embodiments of the present systems and methods may be utilized. Indeed, the embodiments described herein may be used in various IHSs, such as a personal computer (e.g., desktop or laptop), tablet computer, mobile device (e.g., personal digital assistant (PDA) or smart phone), or other electronic devices, such as network router devices, televisions, custom telecommunications equipment for special purpose use, etc. That is, certain techniques described herein are in no way limited to use with the IHS of FIG. 1.

Through fourth generation DDR (DDR4), only one temperature sensor was supported and deployed on each DDR memory module, such as in, on, or associated with, a Register Clock Driver (RCD) of the DIMM. Thermal controlling for a DDR4 DIMM was solely based on this individual temperature sensor. Failure to read this sensor for a few iterations will result in higher fan speed and increase in power consumption. The design of IHSs employing DDR4 included up to eight channels with a two DIMM per Channel (DPC) configuration, which amounts to 48 sensors read for four CPU systems. DDR5 DIMMs have three temperature sensors with different spatial placement.

Figure 2:
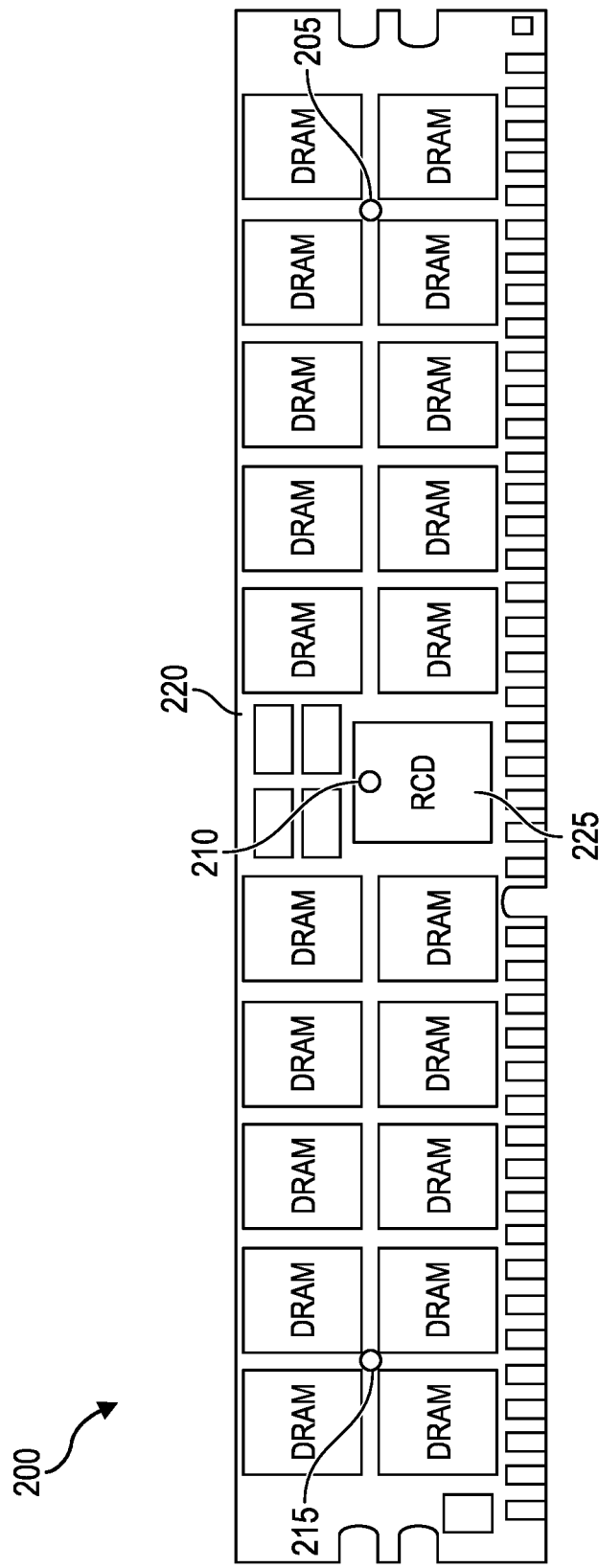
FIG. 2 is an enlarged diagrammatic illustration of an example fifth generation Double Data Rate (DDR) (DDR5) DIMM, such as may be a subject of embodiments of the present systems and methods.

FIG. 2 is an enlarged diagrammatic illustration of example DDR5 DIMM 200, such as may be a subject of embodiments of the present systems and methods. Three temperature sensors, 205, 210 and 215 are deployed on DDR5 DIMM 200. Temperature sensors 205 and 215 are Integrated Circuit (IC) temperature sensors (surface) mounted on DDR5 DIMM Printed Circuit Board (PCB) 220. These sensors may be referred to as "TS1" and "TS2," respectively. Each of these (IC) temperature sensors are strategically placed at the end, or corner, of DIMM 200. Temperature sensor 210 may also be an IC temperature sensor. However, (center) IC temperature sensor 210 is deployed in, on, or associated with, RCD 225. These temperature sensors use an I3C interface, or the like, to provide DIMM temperature telemetry to a fan controller.

In servers (or other IHSs) employing DDR5, the channel count has increased, to up to 12 channels, by way of example. This results in 96 DDR5 temperature sensors for 12 channels with two DPC on four CPU IHSs. Typically, reading every sensor require 96×3 (288) sensors to be read in a round-robin manner, such as by reading the first sensor for the first DIMM, the second senor for the first DIMM, the third sensor for the first DIMM, the first sensor for the next DIMM, the second sensor for that DIMM, the third sensor for that DIMM, etc. This increases sensor read time as well as delay in thermal control algorithm implementation to decide cooling for (a) memory module(s), compared to IHSs employ DDR4 or earlier memory. Table 1 below shows the total number of sensors to be scanned in four CPU Dell® 14$^{th}$, 15$^{th}$ and 16$^{th}$ generation IHSs.

TABLE 1

|  | 14G (DDR4) | 15G (DDR4) | 16G (DDR5) |
| --- | --- | --- | --- |
| Channels | 6 | 8 | 12 |
| DIMM per channel | 2 | 2 | 2 |
| Number of sensors to scan | 1 | 1 | 3 |
| Total Sensor to be scanned for 4 CPU IHS | 48 | 64 | 288 |

Hence, the processing and network resources required for typical implementation of DDR5 temperature sensor data collection mechanisms required for a closed-loop fan control system may adversely affect the performance of the IHS. For instance, sensor data collection mechanisms that rely on round-robin polling of temperature sensors may noticeably impact the operation of the component that is being monitored, such as latency in certain data storage operations resulting from the collection of temperature data from sensors provided by high-speed storage drives. Sensor failures, or other problems that prevent the collection of temperature information required in closed-loop control systems, may result in the cooling system of an IHS failing to respond to rising temperatures, which may cause overheating, and potentially damage, to components of the IHS. Such sensor failures may be detected by the cooling system, but fail-over operations by cooling systems typically involve setting the cooling fan(s) to a safe, but unnecessarily high, fan speed setting, such as full fa speed operation.

Embodiments of the present systems and methods optimize the delay in thermal control algorithm to better manage DIMM temperature action for IHSs employing DDR5 memory modules. To address issue of delay in thermal control for memory module, embodiments of the present systems and methods read one sensor for all (each of the) memory modules at a time for one iteration of fan control, and then move to read next set of memory module sensors for a next iteration of fan control. In various embodiments of the present systems and methods the sensor read can follow either of the following methodologies for optimization. Read one of end sensors 205 or 215 for a first iteration, followed by center senor 210 and then the other of end sensor 215 or 205 in following iterations. For example, wherein end sensor 205 is "A," center sensor 210 is "B" and other end sensor 215 is "C," end sensor A (205) may be read in a first iteration of sensor readings of all of the DDR5 DIMMs in the IHS, followed by center senor B (210) being read in a second iteration of sensor readings of all of the DDR5 DIMMs in the IHS, and end sensor C (215) being read in a third iteration of sensor readings of all of the DDR5 DIMMs in the IHS. In the other such methodology, middle sensor 215 (B) is read for each DDR5 DIMM, followed by right end (corner) sensor 205 (A), followed by middle sensor 215 (B) again, and then left end (corner) SENSOR 215 (C) in the next iteration. This may be considered a better optimized method, in accordance with embodiments of the present systems and methods, 2→1→2→3, 210→205→210→215, B→A→B→C. In both cases, embodiments of the present systems and methods can still run (closed loop) thermal control for the memory module(s) at the present speed and have better control than if a round-robin method of DDR5 DIMM temperature sensor readding methodology was used. Under embodiments of the present systems and methods, at least one sensor reading for each DIMM is obtained in a first iteration and can be confirmed in later iterations of sensor readings.

Figure 3:
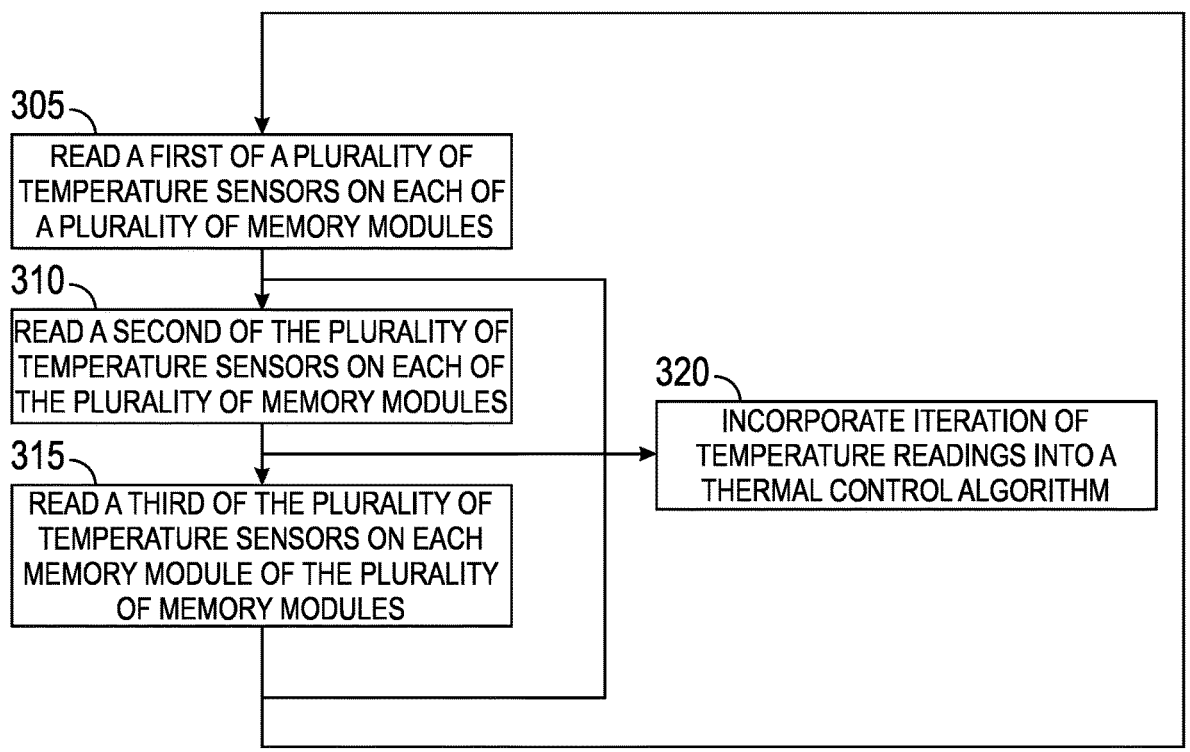
FIG. 3 is a flowchart of an example process for effective reading of multiple temperature sensors on memory modules, according to some embodiments.

FIG. 3 is a flowchart of example process 300 for effective reading of multiple temperature sensors (205 through 215) on memory modules (200), according to some embodiments. Therein, at 305, the IHS (e.g., a fan controller of IHS 100, such as may be incorporated into or associated with chipset 125) in which a plurality of (DDR5) memory modules are deployed reads a first of a plurality of (e.g., three) temperature sensors on each memory module deployed in the IHS. At 310 the IHS (fan controller) reads a second of the plurality of (three) temperature sensors on each memory module deployed in the IHS (after reading the first temperature sensor on each memory module in the IHS, at 305, as illustrated). In the case where the memory modules have three sensors, such as where the memory modules are DDR5 DIMMs, or the like, the third temperature sensor on each memory module deployed in the IHS is read at 315.

Upon reading of each set of sensors, at 305, 310 and 315, the IHS (fan controller) may incorporate the resulting iteration of temperature readings into a thermal control algorithm at 320 to dynamically determine and control coiling (fan speed, etc.) for (each respective) memory module(s) deployed in the IHS. In accordance with various embodiments of the present systems and methods, the thermal control algorithm may be an existing thermal control algorithm which used temperature sensor readings collected in round-robin fashion. Implementation of process 300 provides temperature readings with less delay and in a more dynamic fashion than when the sensors are read in round-robin fashion, regardless of whether the readings are employed in an existing thermal control algorithm, or in a thermal control algorithm optimized in accordance with embodiments of the present systems and methods.

Figure 4:
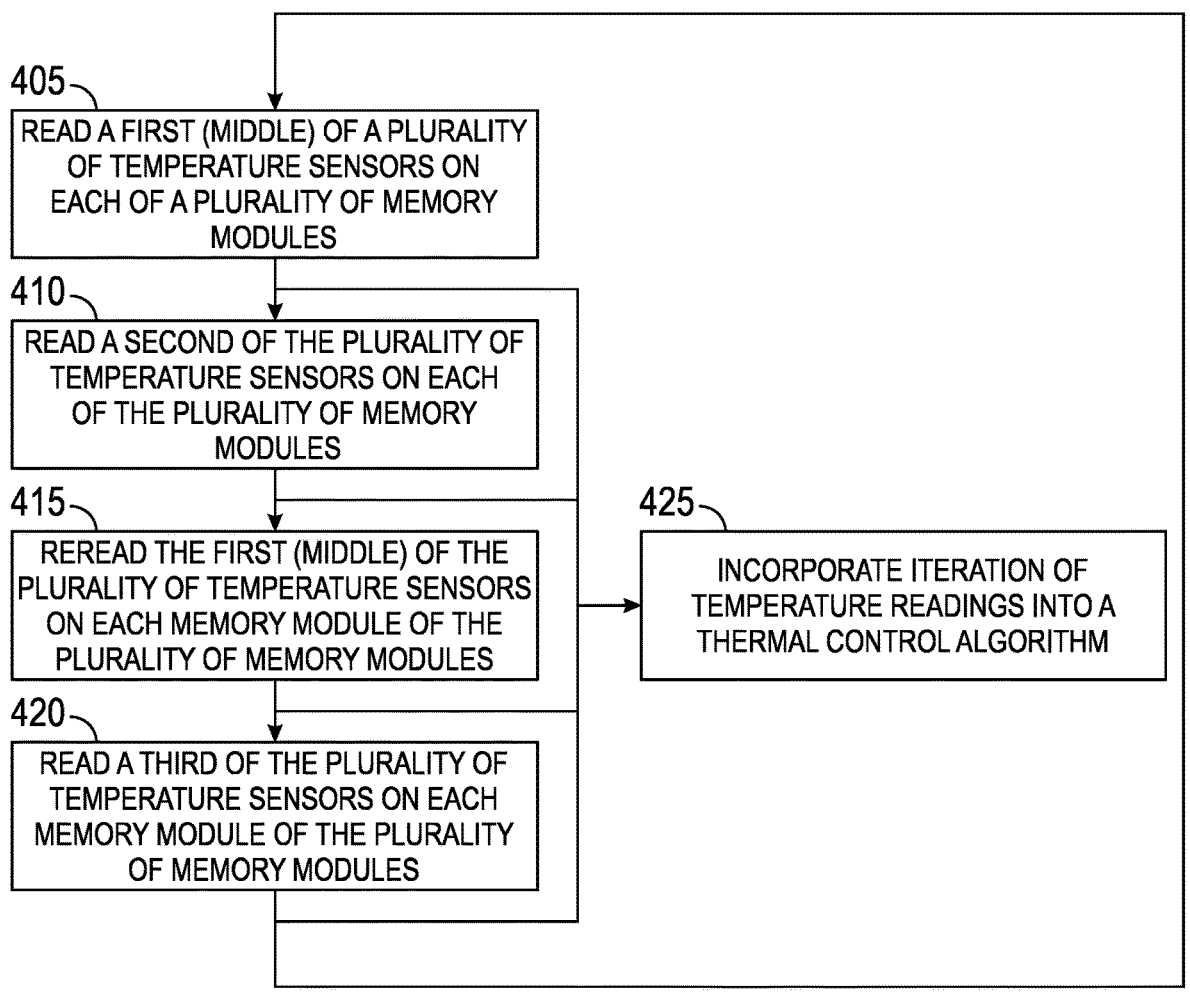
FIG. 4 is a flowchart of another example process for effective reading of multiple temperature sensors on memory modules, according to some embodiments.

FIG. 4 is a flowchart of other example process 400 for effective reading of multiple temperature sensors (205 through 215) on memory modules (200), according to some embodiments. Therein, at 405, the IHS (e.g., a fan controller of IHS 100, such as may be incorporated into or associated with chipset 125) in which a plurality of (DDR5) memory modules are deployed reads a first of a plurality of (e.g., three) temperature sensors on each memory module deployed in the IHS. At 410 the IHS (fan controller) reads a second of the plurality of (three) temperature sensors on each memory module deployed in the IHS (after reading the first temperature sensor on each memory module in the IHS, at 405, as illustrated). At 415, the IHS (fan controller) rereads the first sensor of the plurality of (three) temperature sensors on each memory module deployed in the IHS (after reading the second sensor on each memory module in the IHS, at 410, as illustrated). Then, at 420 the IHS (fan controller) reads a third of the plurality of (three) temperature sensors on each memory module in the IHS (i.e., after rereading the first sensor, at 415, as illustrated). Upon reading of each set of sensors, at 405 through 420, the IHS (fan controller) may incorporate the resulting iteration of temperature readings into a thermal control algorithm at 425 to dynamically determine and control coiling (fan speed, etc.) for (each respective) memory module(s) deployed in the IHS. Again, the thermal control algorithm may, in accordance with various embodiments of the present systems and methods, be an existing thermal control algorithm which typically used temperature sensor readings collected in round-robin fashion.

Further, as discussed in greater detail below with respect to FIG. 6, the first sensor read at 405, and reread at 415, may be a middle (center) temperature sensor (210) on each memory module (DDR5 DIMM 200), and each of the second and third temperature sensors on each memory module, read at 410 and 420, may be opposite end temperature sensors (205 and 215, or 215 and 205, respectively). Thus, process may provide the 2→1→2→3/210→205→210→215/B→A→B→C sensor reading iteration discussed above, and thereby, may provide a more optimized sensor reading methodology than, not only the traditional round-robin methodology of DDR5 DIMM temperature sensor reading methodology, but also, by way of example, may provide a more optimized sensor reading methodology than process 300. Regardless, implementation of process 400 provides temperature readings with less delay and in a more dynamic fashion than when the sensors are read in round-robin fashion, regardless of whether the readings are employed in an existing thermal control algorithm, or in a thermal control algorithm optimized in accordance with embodiments of the present systems and methods.

Embodiments of the present systems and methods also enable handling failure of a DDR5 DIMM temperature sensor without running default full fan speed. As noted, when DIMM temperature sensor failures are detected by a cooling system, fail-over closed loop operations by the cooling system typically results in setting the cooling fan(s) to full speed, as a safety measure. Embodiments of the present systems and methods gracefully handle the fan control. For example, when the coiling system fails to read one sensor, embodiments of the present systems and methods poll neighboring DIMM sensors, and find if the temperature around the failed DIMM temperature sensor is high, or not. If there are no neighboring DIMM present, embodiments of the present systems and methods may rely on existing sensors on the same DIMM. An extrapolated average temperature for the failed sensor may be derived from the maximum temperature reading from one of the (two) working sensors on the same DIMM or from an average temperature reading of neighboring DIMM temperature sensors (whichever is higher).

Figure 5:
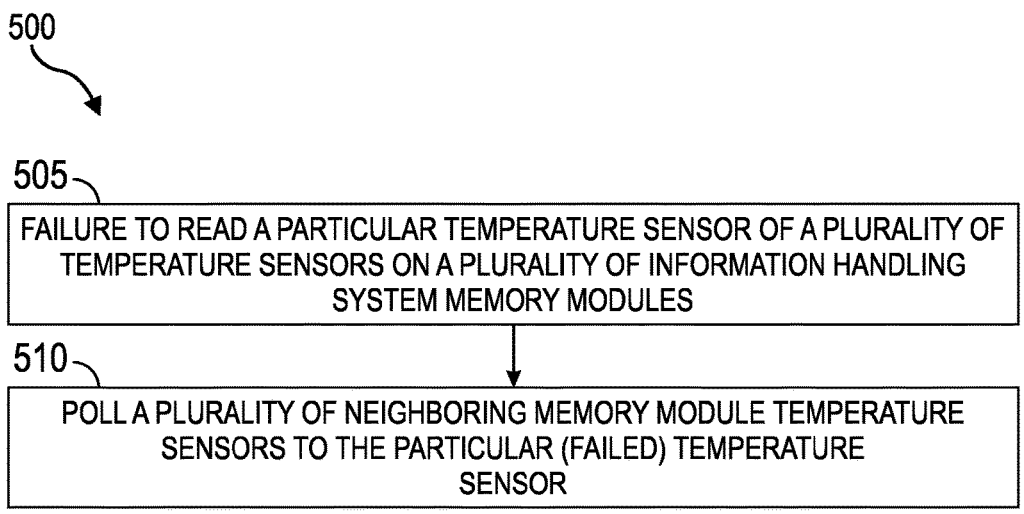
FIG. 5 is a flowchart of an example process for effective handling of failure of a temperature sensor on a memory module, according to some embodiments.

FIG. 5 is a flowchart of example process 500 for effective handling of failure of a temperature sensor on a memory module, according to some embodiments. Therein, such as upon failing, at 505, to read a particular temperature sensor, such as during taking of the readings, or re-readings, at 305, 310, 315, 405, 410, 415 or 420, the IHS (e.g., the fan controller of IHS 100) may, at 510 poll neighboring temperature sensors to the particular (failed) temperature sensor. As discussed in greater detail below with respect to FIG. 6, the neighboring temperature sensors to the particular (failed) temperature sensor may include at least one other temperature sensor on the same memory module as the particular (failed) temperature sensor, and/or neighboring temperature sensors to the particular (failed temperature sensor may include at least one temperature sensor on a memory module adjacent to the memory module of the particular (failed) temperature sensor. As also discussed in greater detail below, with respect to FIG. 6, "rules for neighbors" may be employed in embodiments of the present systems and methods for polling of neighboring sensors to a particular sensor that fails to provide a temperature reading. For example, if the particular (failed) temperature sensor is a middle (center) temperature sensor (210) on a memory module (DDR5 DIMM 200), the polling of neighboring temperature sensors to the particular (failed) temperature sensor may include polling temperature sensors (205 and 215) on each side of the particular (failed) temperature sensor and polling (all) temperature sensors on (THE MOST) adjacent memory module (as discussed (in greater detail) below, with respect to FIG. 6). However, if the particular (failed) temperature sensor is an end (corner) temperature sensor (205 or 215) on a memory module (200), the polling of neighboring temperature sensors to the particular (failed) temperature sensor may include polling the middle temperature sensor (210) on the memory module and polling each adjacent end temperature sensor and each middle temperature sensor on each adjacent memory module (as discussed in greater detail below, with respect to FIG. 6).

Figure 6:
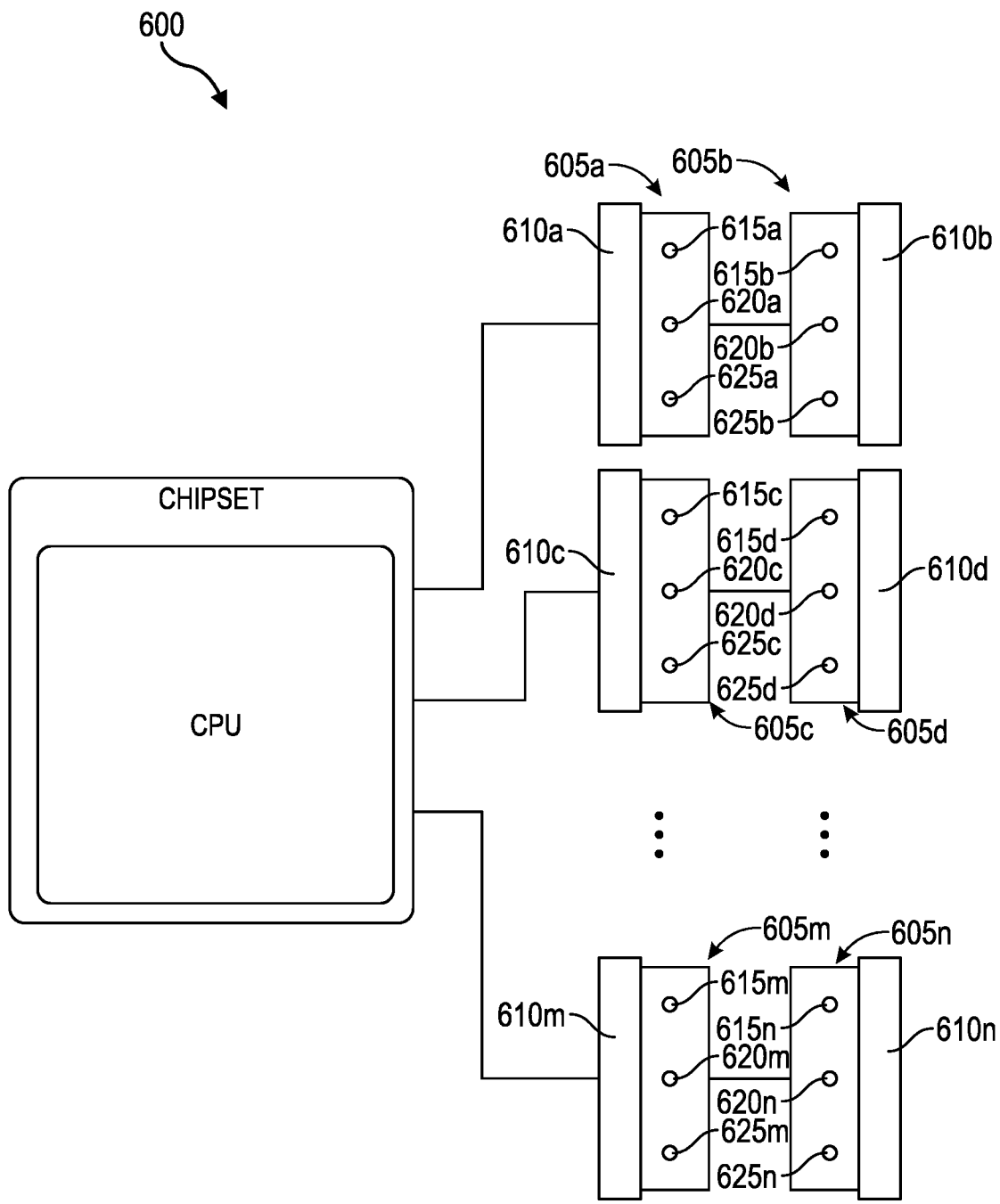
FIG. 6 is a diagrammatic block illustration of an example DDR5 (compression) DIMM layout in an IHS, such as may be a subject of embodiments of the present systems and methods.

FIG. 6 is a diagrammatic block illustration of example DDR5 layout 600 layout in an IHS (100), wherein DDR5 Compression Attached Memory Modules (CAMMs) 605a through 605n are shown for purposes of illustration, and for purposes of discussion below, with respect to processes 300, 400 and 500, in accordance with various embodiments of the present systems and methods. By way of example, CAMMs are affix to the motherboard of an IHS via a connector that may use screws, nuts or other threaded fasteners to attach each of top bolster plate 610a-n to a respective bottom bolster plate, or the like, and apply compression force to deflect spring contacts in a CAMM connector between the CAMM and the IHS PCB to compressively couple the CAMM to the PCB. As noted, CAMMs are illustrated in FIG. 6 for purposes of illustration and discussion, however embodiments of the present systems and methods are equally applicable to Small Outline Dual In-Line Memory Module (SODIMM) mounted memory modules, soldered-in memory modules affixed to an IHS motherboard PCB, etc.

With respect to process 300, effective reading of multiple temperature sensors 615a-n through 625a-n on memory modules 605a-n may include the IHS mounting the memory modules (e.g., a fan controller of IHS 100, such as may be incorporated into or associated with chipset 125) reading one of the plurality of temperature sensors on each memory module deployed (305). For example, the IHS may first read (middle/center) sensors 620a-n of DDR5 CAMMs 605a-n and incorporate the resulting iteration of temperature readings into a thermal control algorithm (320). Then, after reading this first set of temperature sensor, the IHS (fan controller) may reads a second one of the (three) temperature sensors on each memory module deployed in the IHS (310) For example, the IHS may read (end/corner) sensors 615a-n of DDR5 CAMMs 605a-n and incorporate this resulting iteration of temperature readings into the thermal control algorithm (320), thereby dynamically determining and controlling coiling (fan speed, etc.) for (each respective) memory module(s) deployed in the IHS. Next, the third temperature sensor, such as in accordance with the above examples, end/corner sensor 625a-n, on each memory module deployed in the IHS is read (315) by the IHS, and this resulting iteration of temperature readings is incorporated into the thermal control algorithm (320), thereby more dynamically determining and controlling coiling (fan speed, etc.) for (each respective) memory module(s) deployed in the IHS. The above examples discuss reading first the middle sensors, then each of the end/corner sensors on each DIMM, embodiments of the present systems and methods may read the sensors in any such order one end to the other, outside in, randomly, etc. Over time, learning heuristics, or the like, such as may be incorporated into the thermal control algorithm may develop a priority pattern, or map, for reviewing sensor reading, which may in some embodiments, review readings of certain sensors more often than others.

With respect to process 400, effective reading of multiple temperature sensors 615a-n through 625 a-n on memory modules 605a-n, according to some (other) embodiments, may include the IHS (e.g., a fan controller of IHS 100, such as may be incorporated into or associated with chipset 125) reading a first of the three temperature sensors (e.g., middle sensors 620a-n) on each of memory modules 605a-n deployed in the IHS (405). Theses readings are incorporated into the thermal control algorithm (425). Then, a second of the three temperature sensors on each memory module 605a-n, such as end/corner sensors 615a-n, or 625a-n, (410) are read and this iteration of readings are incorporated into the thermal control algorithm (425) dynamically determining and controlling coiling (fan speed, etc.) for (each respective) memory module(s) deployed in the IHS. Thereafter, the IHS (fan controller) may rereads (415) the first (middle) sensors (620a-n) on each memory module 605a-n deployed in the IHS and incorporate the resulting iteration of temperature readings into the thermal control algorithm (4250), thereby further dynamically determining and controlling coiling (fan speed, etc.) for (each respective) memory module(s) 605a-n. Then the IHS (fan controller) reads the (remaining third of the three temperature sensors 625a-n, or 615a-n, (420) on each memory module in the IHS (i.e., after rereading the first (middle) sensor (415)). The IHS (fan controller) then incorporates this iteration of sensor readings into the thermal control algorithm (425) to, still further, dynamically determine and control coiling (fan speed, etc.) for (each respective) memory module(s) 605a-n.

Thereby, embodiments of the present systems and methods may employ a set priority pattern, or map, for reviewing sensor reading that review readings of certain sensors more often than others. However, over time, learning heuristics, or the like, such as may be incorporated into the thermal control algorithm may develop other, or further, priority patterns, or maps, for reviewing sensor reading.

Again, the thermal control algorithm may, in accordance with various embodiments of the present systems and methods, be an existing thermal control algorithm which typically used temperature sensor readings collected in round-robin fashion.

As noted above with respect to the description of process 400, the reading of middle temperature sensors 620*a-n* of DDR5 CAMMs 605*a-n*, reading one of the end/corner sensors 615*a-n* or 625*a-n* on each of CAMMs 605*a-n*, rereading the middle sensors 620*a-m* on each CAMM 605*a-n*, and then reading the other of the end/corner sensors 625*a-n* or 615*a-n* on each of CAMMs 605*a-n*, as described above may provide the 2→1→2→3/620→615→620→625/B→A→13→C sensor reading iteration such as discussed above. As also noted, this may provide a more optimized sensor reading methodology than, not only the traditional round-robin methodology of DDR5 DIMM temperature sensor reading methodology, but also, by way of example, may provide a more optimized sensor reading methodology than process 300.

With respect to process 500 for effective handling of failure of a temperature sensor on a memory module, upon a particular temperature sensor failing (505) to provide a reading, such as during taking of the readings, or re-readings (305, 310, 315, 405, 410, 415 and/or 420), the IHS (e.g., the fan controller of IHS 100) may, as noted, poll (510) neighboring temperature sensors to the particular (failed) temperature sensor. As discussed, the neighboring temperature sensors to the particular (failed) temperature sensor may include at least one other temperature sensor on the same memory module as the particular (failed) temperature sensor, and/or neighboring temperature sensors to the particular (failed temperature sensor may include at least one temperature sensor on a memory module adjacent to the memory module of the particular (failed) temperature sensor. For example, in implementation of the above-mentioned "rules for neighbors" for polling of neighboring sensors to a particular sensor that has failed to provide a temperature reading, if the particular (failed) temperature sensor is a middle temperature sensor, such as sensor 620*c* on DDR5 CAMM 605*c*, by way of example, the polling of neighboring temperature sensors to particular (failed) temperature sensor 620*c* may include polling temperature sensors 615*c* and 625*c* on each side of particular (failed) temperature sensor 620*c* on DDR5 CAMM 605*c*, and polling (all of) adjacent temperature sensors 615*d*, 620*d* and 625*d* on adjacent memory module 605*d*. However, if the particular (failed) temperature sensor is an end (corner) temperature sensor, such as by way of example sensor 615*d* on a memory module 605*d*, the polling of neighboring temperature sensors to particular (failed) temperature sensor 615*d* may include polling middle temperature sensor 620*d* on the same memory module, 605*d*, and polling each adjacent end temperature sensors 625*b*, 625*a* and 615*c*, and (each) middle temperature sensor 620*b*, 620*a* and 620*c*, on (each) adjacent memory module 620*a-c*.

In accordance with the foregoing, embodiments of the present systems and methods gracefully handle the increased DIMM sensors presented in IHSs employing DDR5 memory. Embodiments of the present systems and methods, also result in zero, to limited, impact to thermal control, compared to IHSs employing DDR4 (or earlier) memory, by optimizing DIMM temperature sensor readings. Embodiments of the present systems and methods also provide (a) better way(s) to handle temperature failure cases, such as by leveraging the presence of multiple temperature sensor on each DDR5 DIMM. Further, embodiments of the present systems and methods result in power savings, such as by delaying increases to fan speed which might result from sensor failure in round-robin reading of numerous DDR5 DIMM temperature sensors.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

To implement various operations described herein, computer program code (i.e., instructions for carrying out these operations) may be written in any combination of one or more programming languages, including an object-oriented programming language such as Java, Smalltalk, Python, C++, or the like, conventional procedural programming languages, such as the "C" programming language or similar programming languages, or any of machine learning software. These program instructions may also be stored in a computer readable storage medium that can direct a computer system, other programmable data processing apparatus, controller, or other device to operate in a particular manner, such that the instructions stored in the computer readable medium produce an article of manufacture including instructions which implement the operations specified in the block diagram block or blocks. The program instructions may also be loaded onto a computer, other programmable data processing apparatus, controller, or other device to cause a series of operations to be performed on the computer, or other programmable apparatus or devices, to produce a computer implemented process such that the instructions upon execution provide processes for implementing the operations specified in the block diagram block or blocks.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation(s).

Modules implemented in software for execution by various types of processors may, for instance, include one or more physical or logical blocks of computer instructions, which may, for instance, be organized as an object or procedure. Nevertheless, the executables of an identified module need not be physically located together but may include disparate instructions stored in different locations which, when joined logically together, include the module and achieve the stated purpose for the module. Indeed, a module of executable code may be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different storage devices.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Unless stated otherwise, terms such as "first," "second," "third," etc. are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

The invention claimed is:

1. A method to effectively read multiple temperature sensors on memory modules, comprising:
    reading a first of a plurality of temperature sensors on each memory module of a plurality of memory modules;
    reading a second of the plurality of temperature sensors on each memory module of the plurality of memory modules, after reading the first of the plurality of temperature sensors on each memory module of the plurality of memory modules; and
    in response to failing to read a temperature from a particular temperature sensor, polling neighboring temperature sensors of the particular temperature sensor for temperature readings, wherein selected neighboring temperature sensors are chosen for polling based at least in part on at least one predetermined rule governing polling of temperature sensors neighboring a temperature sensor that failed to provide a temperature reading.

2. The method of claim 1, further comprising reading a third of the plurality of temperature sensors on each memory module of the plurality of memory modules, after reading the second of the plurality of temperature sensors on each memory module of the plurality of memory modules.

3. The method of claim 1, further comprising:
    rereading the first of the plurality of temperature sensors on each memory module of the plurality of memory modules, after reading the second of the plurality of temperature sensors on each memory module of the plurality of memory modules; and
    reading a third of the plurality of temperature sensors on each memory module of the plurality of memory modules, after rereading the first of the plurality of temperature sensors on each memory module of the plurality of memory modules.

4. The method of claim 3, wherein the first of the plurality of temperature sensors on each memory module is a middle temperature sensor on each memory module.

5. The method of claim 1, further comprising:
    in response to failing to read the temperature from the particular temperature sensor, incorporating the temperature readings from the selected neighboring temperature sensors into a fan speed control algorithm.

6. The method of claim 5, wherein the neighboring temperature sensors of the particular temperature sensor comprise at least one other temperature sensor on the memory module having the particular temperature sensor.

7. The method of claim 5, wherein the neighboring temperature sensors of the particular temperature sensor comprise at least one temperature sensor on a memory module adjacent to a memory module of the particular temperature sensor.

8. The method of claim 5, wherein the particular temperature sensor is a middle temperature sensor on a memory module and polling neighboring temperature sensors of the particular temperature sensor comprises polling temperature sensors on each side of the particular temperature sensor on the memory module and polling temperature sensors on each adjacent memory module.

9. The method of claim 5, wherein the particular temperature sensor is an end temperature sensor on a memory module and polling neighboring temperature sensors of the particular temperature sensor comprises polling a middle temperature sensor on the memory module and polling each adjacent end temperature sensor and each middle temperature sensor on each adjacent memory module.

10. An information handling system comprising:
    a plurality of memory modules, each memory module comprising a plurality of temperature sensors; and
    a fan controller configured to:
        read a first of the plurality of temperature sensors on each memory module of the plurality of memory modules;
        read a second of the plurality of temperature sensors on each memory module of the plurality of memory modules, after reading the first of the plurality of temperature sensors on each memory module of the plurality of memory modules;
        in response to failing to read a temperature from a particular temperature sensor, polling neighboring temperature sensors of the particular temperature sensor for temperature readings, wherein selected neighboring temperature sensors are chosen for polling based at least in part on at least one predetermined rule governing polling of temperature sensors neighboring a temperature sensor that failed to provide a temperature reading; and incorporate the temperature readings from the selected neighboring temperature sensors into a fan speed control algorithm.

11. The information handling system of claim 10, wherein the fan controller is further configured to read a third of the plurality of temperature sensors on each memory module of the plurality of memory modules, after reading the second of the plurality of temperature sensors on each memory module of the plurality of memory modules.

12. The information handling system of claim 10, wherein the fan controller is further configured to:

reread the first of the plurality of temperature sensors on each memory module of the plurality of memory modules, after reading the second of the plurality of temperature sensors on each memory module of the plurality of memory modules; and read a third of the plurality of temperature sensors on each memory module of the plurality of memory modules, after rereading the first of the plurality of temperature sensors on each memory module of the plurality of memory modules.

13. The information handling system of claim 12, wherein the first of the plurality of temperature sensors on each memory module is a middle temperature sensor on each memory module.

14. The information handling system of claim 10, wherein incorporate the temperature readings further comprises determine an extrapolated average temperature for the particular temperature sensor, based at least in part on a maximum of temperature readings from the selected neighboring temperature sensors.

15. The information handling system of claim 14, wherein the neighboring temperature sensors of the particular temperature sensor comprise at least one other temperature sensor on the memory module having the particular temperature sensor.

16. The information handling system of claim 14, wherein the neighboring temperature sensors of the particular temperature sensor comprise at least one temperature sensor on a memory module adjacent to a memory module of the particular temperature sensor.

17. The information handling system of claim 14, wherein the particular temperature sensor is a middle temperature sensor on a memory module and the fan controller is further configured to poll temperature sensors on each side of the particular temperature sensor on the memory module and poll temperature sensors on each adjacent memory module.

18. The information handling system of claim 14, wherein the particular temperature sensor is an end temperature sensor on a memory module and the fan controller is further configured to poll a middle temperature sensor on the memory module and poll each adjacent end temperature sensor and each middle temperature sensor on each adjacent memory module.

19. A non-transitory computer readable medium having program instructions stored thereon that, upon execution by an information handling system cause the information handling system to:

read a first of three temperature sensors on each memory module of a plurality of memory modules deployed in the information handling system;

read a second of the three temperature sensors on each memory module of the plurality of memory modules, after reading the first of the three temperature sensors on each memory module of the plurality of memory modules;

read a third of the three temperature sensors on each memory module of the plurality of memory modules, after reading the second of the three temperature sensors on each memory module of the plurality of memory modules;

in response to failing to read a temperature from a particular temperature sensor, polling neighboring temperature sensors of the particular temperature sensor for temperature readings, wherein selected neighboring temperature sensors are chosen for polling based at least in part on at least one predetermined rule governing polling of temperature sensors neighboring a temperature sensor that failed to provide a temperature reading; and incorporate the temperature readings from the selected neighboring temperature sensors into a fan speed control algorithm, comprising determine an extrapolated average temperature for the particular temperature sensor, based at least in part on a maximum of temperature readings determined from the selected neighboring temperature sensors.

20. The non-transitory computer readable medium of claim 19, wherein, upon execution by the information handling system the program instructions further cause the information handling system to;

determine the extrapolated average temperature for the particular temperature sensor based at least in part on an average of temperature readings determined from the selected neighboring temperature sensors;

determine a greater extrapolated temperature of: the maximum of temperature readings and the average of temperature readings; and incorporate the greater extrapolated temperature into the fan speed control algorithm.

* * * * *